United States Patent
Hori et al.

(10) Patent No.: US 11,082,026 B2
(45) Date of Patent: Aug. 3, 2021

(54) JOINED BODY OF PIEZOELECTRIC MATERIAL SUBSTRATE AND SUPPORT SUBSTRATE

(71) Applicant: NGK INSULATORS, LTD., Nagoya (JP)

(72) Inventors: Yuji Hori, Owariasahi (JP); Tatsuro Takagaki, Nagoya (JP)

(73) Assignee: NGK INSULATORS, LTD., Nagoya (JP)

(*) Notice: Subject to any disclaimer, the term of this patent is extended or adjusted under 35 U.S.C. 154(b) by 0 days.

(21) Appl. No.: 17/097,129

(22) Filed: Nov. 13, 2020

(65) Prior Publication Data

US 2021/0067130 A1    Mar. 4, 2021

Related U.S. Application Data

(63) Continuation of application No. PCT/JP2019/005960, filed on Feb. 19, 2019.

(30) Foreign Application Priority Data

May 16, 2018 (JP) .............................. JP2018-094524

(51) Int. Cl.
*H03H 9/02* (2006.01)
*H01L 41/312* (2013.01)
(Continued)

(52) U.S. Cl.
CPC ......... *H03H 9/02574* (2013.01); *C23C 14/08* (2013.01); *C23C 14/10* (2013.01);
(Continued)

(58) Field of Classification Search
CPC ........... H03H 9/02559; H03H 9/02574; H03H 9/02834; H03H 9/02866; H03H 9/02897;
(Continued)

(56) References Cited

U.S. PATENT DOCUMENTS 8,729,771 B2    5/2014   Kobayashi et al.
9,831,848 B2    11/2017  Watanabe et al.
(Continued)

FOREIGN PATENT DOCUMENTS

JP   2001-053579 A   *   2/2001
JP   3774782 B2           12/2004
(Continued)

OTHER PUBLICATIONS

Yoshikaju Zikuhara et al., Sequential Activation Process of oxygen RIE and nitrogen Radical for LiTaO3 and Si Wafer Bonding, ECS Transactions, 3 (6) 91-98 (2006) (9 pages).
(Continued)

*Primary Examiner* — Barbara Summons
(74) *Attorney, Agent, or Firm* — Flynn Thiel, P.C.

(57) ABSTRACT

A bonded body includes a supporting substrate; a piezoelectric material substrate composed of a material selected from the group consisting of lithium niobate, lithium tantalate and lithium niobate-lithium tantalate; and a bonding layer bonding the supporting substrate and the piezoelectric material substrate and contacting a main surface of the piezoelectric material substrate. The bonding layer includes a void extending from the piezoelectric material substrate toward the supporting substrate. A ratio (t2/t1) of a width t2 at an end of the void on a side of the supporting substrate with respect to a width t1 at an end of the void on a side of the piezoelectric material substrate is 0.8 or lower.

8 Claims, 15 Drawing Sheets

(51) Int. Cl.
  *H03H 9/25* (2006.01)
  *H01L 41/337* (2013.01)
  *H01L 41/187* (2006.01)
  *C30B 33/06* (2006.01)
  *C23C 14/10* (2006.01)
  *C23C 14/08* (2006.01)
  *C30B 29/30* (2006.01)
  *H01L 41/313* (2013.01)

(52) U.S. Cl.
  CPC .............. *C30B 29/30* (2013.01); *C30B 33/06* (2013.01); *H01L 41/187* (2013.01); *H01L 41/312* (2013.01); *H01L 41/313* (2013.01); *H01L 41/337* (2013.01); *H03H 9/02559* (2013.01); *H03H 9/02897* (2013.01); *H03H 9/25* (2013.01); *H03H 9/02834* (2013.01)

(58) Field of Classification Search
  CPC .......... H03H 9/25; H03H 3/08; H01L 41/187; H01L 41/337; H01L 41/312; H01L 41/313; C23C 14/08; C23C 14/10; C30B 29/30; C30B 33/06
  USPC .................................................. 333/193–195
  See application file for complete search history.

(56) References Cited

U.S. PATENT DOCUMENTS

| | | | |
|---|---|---|---|
| 2004/0226162 A1 | 11/2004 | Miura et al. | |
| 2010/0141086 A1 | 6/2010 | Suzuki et al. | |
| 2012/0098387 A1* | 4/2012 | Iwamoto | H03H 3/08 310/313 B |
| 2012/0126669 A1* | 5/2012 | Kobayashi | H03H 3/08 310/367 |
| 2013/0234805 A1 | 9/2013 | Takahashi | |
| 2013/0285768 A1 | 10/2013 | Watanabe et al. | |
| 2018/0175283 A1 | 6/2018 | Akiyama et al. | |
| 2019/0036009 A1 | 1/2019 | Tai et al. | |
| 2019/0051538 A1 | 2/2019 | Fujioka et al. | |
| 2019/0199311 A1* | 6/2019 | Yoshioka | H03H 9/10 |
| 2021/0006224 A1* | 1/2021 | Hori | H03H 9/02574 |
| 2021/0067129 A1* | 3/2021 | Hori | C23C 14/08 |

FOREIGN PATENT DOCUMENTS

| | | |
|---|---|---|
| JP | 2011-87079 A | 4/2011 |
| JP | 5814727 B2 | 4/2012 |
| JP | 2012-174981 A | 9/2012 |
| JP | 2014-86400 A | 5/2014 |
| JP | 2014-183054 A | 9/2014 |
| JP | 2015-73331 A | 4/2015 |
| JP | 5910763 B2 | 4/2015 |
| JP | 2015-103744 A | 6/2015 |
| JP | 2016-225537 A | 12/2016 |
| WO | 2017/159682 A1 | 9/2017 |
| WO | 2017/163722 A1 | 9/2017 |

OTHER PUBLICATIONS

T. Plach et al., Mechanisms for room temperature direct wafer bonding, Journal of Applied Physics 113, 094905 (2013) (8 pages).
International Search Report, with English translation, issued in corresponding International Application No. PCT/JP2019/005960, dated May 7, 2019 (5 pages).
Written Opinion of International Searching Authority issued in corresponding International Application No. PCT/JP2019/005960, dated May 7, 2019 (5 pages).
Office Action from German Patent Office issued in corresponding German Application No. 11 2019 001 960.0 with English Translation dated Apr. 6, 2021 (12 pages).

* cited by examiner

JOINED BODY OF PIEZOELECTRIC MATERIAL SUBSTRATE AND SUPPORT SUBSTRATE

CROSS-REFERENCE TO RELATED APPLICATIONS

This is a continuation application of PCT/JP2019/005960, filed Feb. 19, 2019, which claims priority to Japanese Application No. JP2018-094524, filed May 16, 2018, the entire contents of which are hereby incorporated by reference.

TECHNICAL FIELD

The present invention relates to a bonded body of a piezoelectric material substrate and supporting substrate.

BACKGROUND ARTS

It has been widely used an SOI substrate composed of a high resistance Si/SiO$_2$ thin film/Si thin film, for realizing a high-performance semiconductor device. Plasma activation is applied for realizing the SOI substrate. This is because the bonding can be realized at a relatively low temperature (400° C.). It is proposed a composite substrate composed of similar Si/SiO$_2$ thin film/piezoelectric thin film for improving the performance of a piezoelectric device (patent document 1). According to patent document 1, the piezoelectric material substrate composed of lithium niobate or lithium tantalate and silicon substrate with a silicon oxide layer formed thereon are activated by ion activation method, followed by the bonding.

It is proposed a filter having a multi-layered structure including a single or plural dielectric film at the bonding interface (Patent document 2). However, there is hardly known information concerning the bonding technique for realizing the structure of lithium tantalate/silicon oxide/silicon.

It is described, in patent document 3, that lithium tantalate and sapphire or a ceramic material are bonded through a silicon oxide layer by plasma activation method.

Further, according to a surface acoustic wave filter by adhering lithium tantalate and sapphire through a silicon oxide layer, it is known that bulk wave is generated at the bonding interface and unnecessary response is observed in transmission and high frequency bands. For preventing this, it is proposed the technique of introducing a roughened surface at the bonding interface to scatter the bulk wave and to suppress the unnecessary response. At this time, it is published that the roughened surface is filled with an inorganic material and then polished to provide a flattened surface (Patent document 4).

Non-Patent Documents (Non-patent document 1) ECS Transactions, 3 (6) 91-98 (2006)
(Non-patent document 2) J. Applied Physics 113, 094905 (2013)

Patent Documents (Patent document 1) Japanese Patent Publication No. 2016-225537A
(Patent document 2) Japanese Patent No. 5910763B
(Patent document 3) Japanese Patent No. 3774782B
(Patent document 4) Japanese Patent No. 5814727B

SUMMARY OF THE INVENTION

However, different kinds of materials having different thermal expansion coefficients are introduced into the bonding interface, meaning that a stress is generated during a heating step included in wafer processing. Thus, after the bonded body is subjected to heat treatment, there is a problem that the fracture of the bonded body or separation of the piezoelectric material substrate frequently occurs due to the stress.

An object of the present invention is, in bonding a piezoelectric material substrate to a supporting substrate through a bonding layer, to prevent the fracture of the thus obtained bonded body and the separation of the piezoelectric material substrate when the bonded body is subjected to a heat treatment.

The present invention provides a bonded body comprising:

a supporting substrate;

a piezoelectric material substrate comprising a material selected from the group consisting of lithium niobate, lithium tantalate and lithium niobate-lithium tantalate; and a bonding layer bonding the supporting substrate and the piezoelectric material substrate and contacting a main surface of the piezoelectric material substrate, wherein the bonding layer comprises a void extending from the piezoelectric material substrate toward the supporting substrate, and wherein a ratio (t2/t1) of a width t2 at an end of the void on a side of the supporting substrate with respect to a width t1 at an end of the void on a side of the piezoelectric material substrate is 0.8 or lower.

When a roughened surface is formed on a main surface of the piezoelectric material substrate and a bonding layer composed of silicon oxide, tantalum pentoxide or the like is formed on the roughened surface, the inventors researched the film-forming conditions of the bonding layer. Until now, it has been considered that a dense bonding layer is necessarily film-formed for assuring the bonding strength and it has been applied the conditions for generating dense crystal at a relatively low rate. However, in this case, as the piezoelectric material substrate is thinned by processing and then subjected to a heat treatment, the thinned piezoelectric material substrate tends to be separated from the supporting substrate.

As the inventors have researched the microstructure of the dense bonding layer for solving the problem, voids or cracks were not specifically observed in the bonding layer. Thus, they changed the concept and tried to raise the film-forming rate of the bonding layer. It is thus found that voids are generated mainly from the recesses as starting points of the piezoelectric material substrate. Then, in the case that such voids are generated in the bonding layer, it is found that the separation of the piezoelectric material substrate is suppressed.

However, when the thickness of the piezoelectric layer is made very small further by processing, it is proved that the separation of the piezoelectric material substrate may still occur and that a sufficiently strong bonding may not be realized only by providing the voids in the bonding layer.

Thus, the inventors tried to polish the surface of the bonding layer after the bonding layer is film-formed on the piezoelectric material substrate so that the cross-sectional shape of the void is variously changed. As a result, by sufficiently reducing the width t2 of the void at the end on the side of the supporting substrate compared with the width t1 of the void at the end on the side of the piezoelectric material substrate, specifically by 0.8 folds or lower, it is particularly found that the fracture of the bonded body and the separation of the piezoelectric material substrate are suppressed. The present invention is thus made.

Although it is not clear the reason why such considerable effects are obtained, as the width of the void extending from the piezoelectric material substrate side toward the supporting substrate side is narrower toward the supporting substrate side, it is considered that the mechanical stress applied by the processing and thermal stress applied by the heating are appropriately dispersed.

EMBODIMENTS FOR CARRYING OUT THE INVENTION

The present invention will be described in detail, appropriately referring to drawings.

Figure 1A:
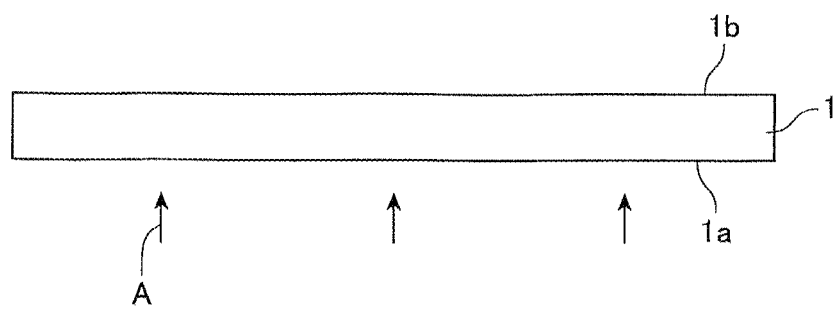
FIG. 1(a) shows the state that a main surface 1a of a piezoelectric material substrate 1 is processed.
Figure 1B:
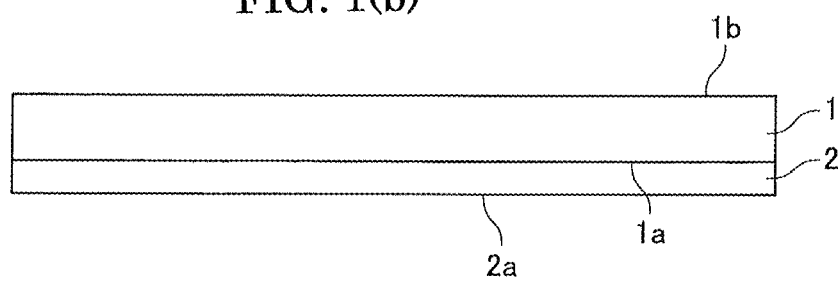
FIG. 1(b) shows the state that a bonding layer 2 is provided on the main surface 1a of the piezoelectric material substrate 1.
Figure 1C:
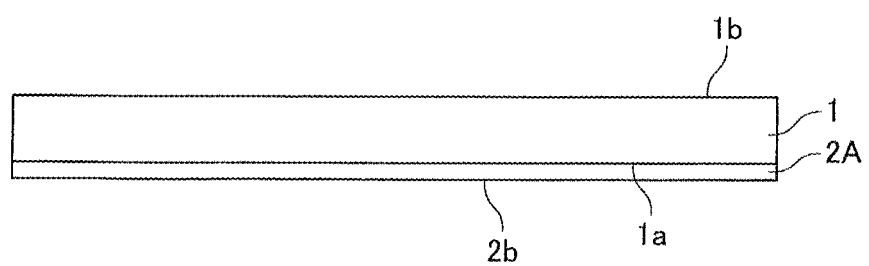
FIG. 1(c) shows the state that the main surface 2a of the bonding layer 2 is polished into a polished surface 2b.
Figure 1D:
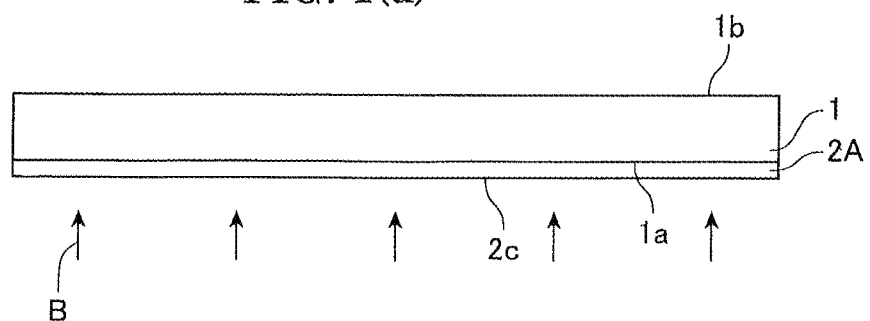
FIG. 1(d) shows the state that plasma B is irradiate onto the polished surface of a bonding layer 2A for the activation.

First, as shown in FIG. 1(a), it is prepared a piezoelectric material substrate 1 having a pair of main surfaces 1a and 1b. Processing A is then applied onto the main surface 1a to perform the roughening. Then, as shown in FIG. 1(b), a bonding layer 2 is film-formed on the main surface 1a of the piezoelectric material substrate 1. A surface 2a of the bonding layer 2 is then subjected to polishing for thinning the bonding layer 2A at some degree to generate a polished surface 2b, as shown in FIG. 1(c). Then, as shown in FIG. 1(d), plasma is irradiated onto the polished surface 2b as arrows B to obtain a surface-activated bonding surface 2c.

Figure 2A:
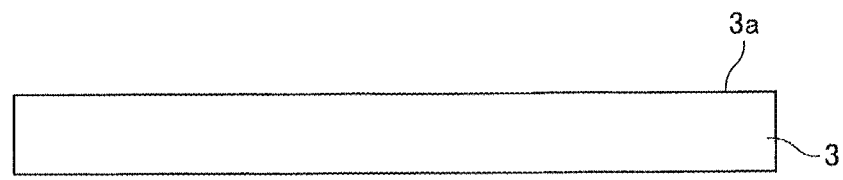
FIG. 2(a) shows a supporting substrate 3.

Further, as shown in FIG. 2(a), it is prepared a supporting substrate 3 having a main surface 3a. Then, plasma is irradiated onto the main surface of the supporting substrate 3 as arrows C to perform the surface activation to form an activated bonding surface 3b.

Figure 3A:
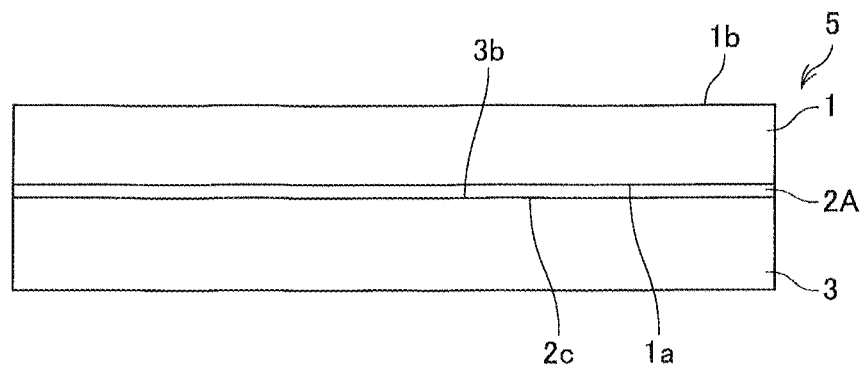
FIG. 3(a) shows a bonded body 5 of the piezoelectric material substrate 1 and supporting substrate 3.

Then, the activated bonding surface 2c of the bonding layer 2 on the piezoelectric material substrate and the activated bonding surface 3b of the supporting substrate 3 are contacted and directly bonded with each other to obtain a bonded body 5 shown in FIG. 3(a).

Figure 3B:
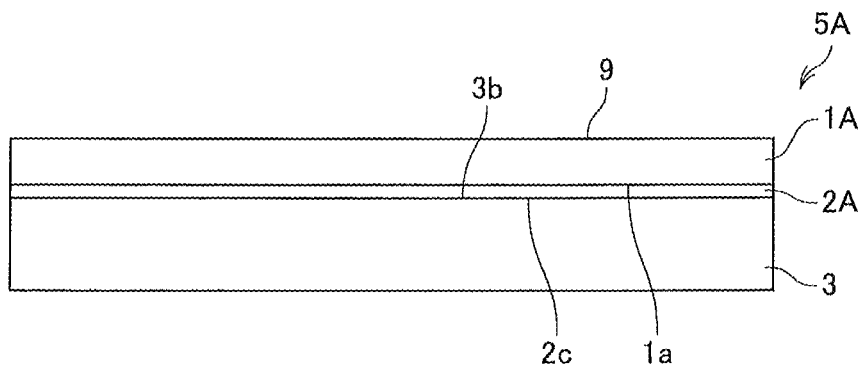
FIG. 3(b) shows the state that a piezoelectric material substrate 1A of a bonded body 5A is thinned by processing.
Figure 3C:
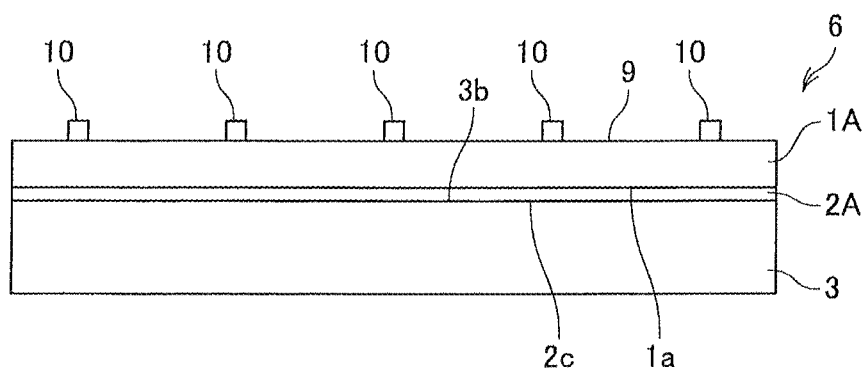
FIG. 3(c) shows an acoustic wave device 6.

At the state, electrodes may be provided on the piezoelectric material substrate 1. However, preferably, as shown in FIG. 3(b), a main surface 1b of the piezoelectric material substrate 1 is processed to thin the substrate 1 to obtain a thinned piezoelectric material substrate 1A, providing a bonded body 5A. 9 represents a processed surface. Then, as shown in FIG. 3(c), predetermined electrodes 10 are formed on the processed surface 9 of the piezoelectric material substrate 1A of the bonded body 5A to obtain an acoustic wave device 6.

Further, an intermediate layer may be provided between the bonding layer 2 and supporting substrate 3. FIGS. 4 and 5 relate to this embodiment.

According to the present example, as shown in FIG. 1(a), it is prepared a piezoelectric material substrate 1 having a pair of main surfaces 1a and 1b. Processing A is then performed on the main surface 1a to perform the roughening. Then, as shown in FIG. 1(b), a bonding layer 2 is film-formed on the main surface 1a of the piezoelectric material substrate 1. Then, the main surface 2a of the bonding layer 2 was subjected to polishing process to make a bonding layer 2A thinner to some degree to generate the polished surface 2b, as shown in FIG. 1(c). Then, as shown in FIG. 1(d), plasma is irradiated onto the polished surface 2b as arrows B to obtain a surface-activated bonding surface 2c.

Figure 4A:
FIG. 4(a) shows the supporting substrate 3.
Figure 4B:
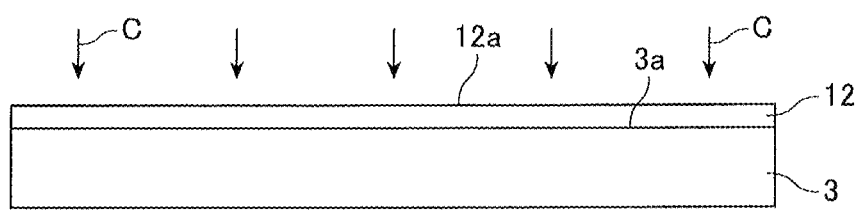
FIG. 4(b) shows the state that a bonding surface 12a of an intermediate layer 12 on the supporting substrate 3 is activated.

Further, as shown in FIG. 4(a), it is prepared a supporting substrate 3 having a main surface 3a. Then, as shown in FIG. 4(b), an intermediate layer 12 is formed on the main surface 3a of the supporting substrate 3, and plasma is irradiated onto the surface of the intermediate layer 12 as arrow C to perform the surface activation to form an activated bonding surface 12a.

Figure 5A:
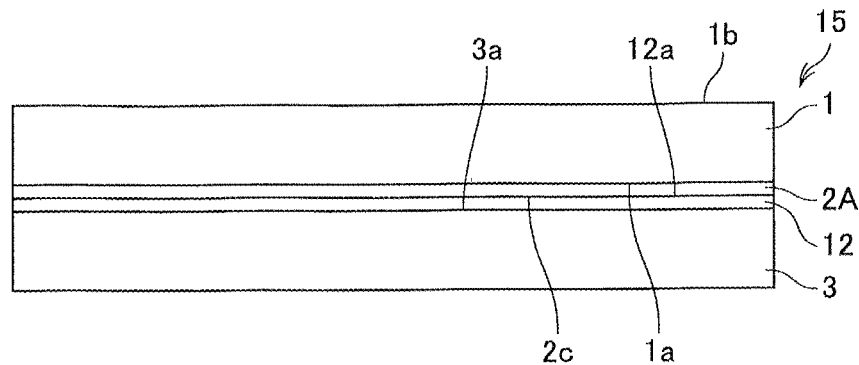
FIG. 5(a) shows a bonded body 15 of the piezoelectric material substrate 1 and supporting substrate 3.

Then, the activated bonding surface 2c of the bonding layer 2 on the piezoelectric material substrate and the activated bonding surface 12a of the intermediate layer 12 on the supporting substrate 3 are contacted and directly bonded with each other, to obtain a bonded body 15 shown in FIG. 5(a).

Figure 5B:
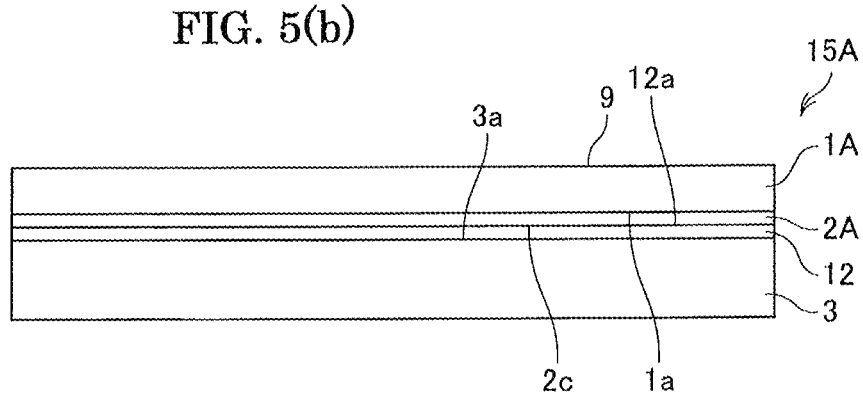
FIG. 5(b) shows the state that a piezoelectric material substrate 1A of a bonded body 15A is thinned by processing.
Figure 5C:
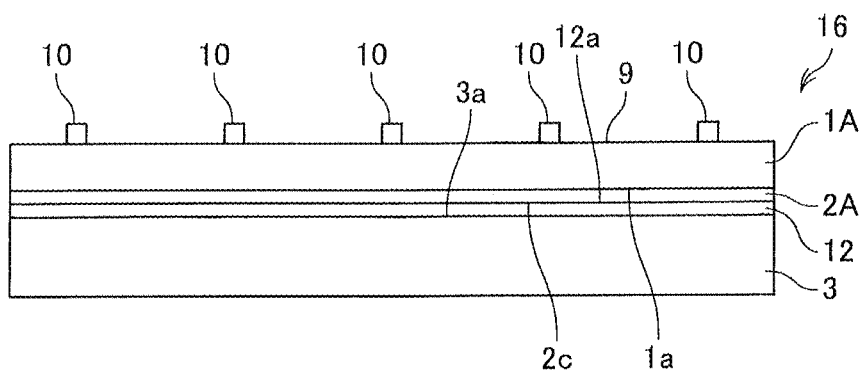
FIG. 5(c) shows an acoustic wave device 16.

At the state, electrodes may be provided on the piezoelectric material substrate 1. However, preferably, as shown in FIG. 5(b), a main surface 1b of the piezoelectric material substrate 1 is processed to thin the substrate 1 to obtain a thinned piezoelectric material substrate 1A, providing a bonded body 15A. 9 represents a processed surface. Then, as shown in FIG. 5(c), predetermined electrodes 10 are formed on the processed surface 9 of the piezoelectric material substrate 1A of the bonded body 15A to obtain an acoustic wave device 16.

According to the present invention, a void is provided extending from the piezoelectric material substrate 1(1A) toward the supporting substrate in the bonding layer 2A. Then, the ratio (t2/t1) of the width t2 of the void at the end on the side of the supporting substrate with respect to the width t1 of the void on the side of the piezoelectric material substrate is 0.8 or lower.

For example, FIGS. 6, 8, 10 and 12 show photographs of cross sections of the bonding layers and voids according to the inventive examples, respectively, and FIGS. 7, 9, 11 and 13 are schematic diagrams for the illustration corresponding with FIGS. 6, 8, 10 and 12, respectively. It is formed elongate voids 22 and 23 extending from the piezoelectric material substrate 1(1A) toward the supporting substrate 3 in the bonding layer 2A between the piezoelectric material substrate 1(1A) and supporting substrate 2A.

According to the present embodiment, it is understood that the respective voids 22 and 23 are extended from the main surface 1a of the piezoelectric material substrate 1(1A) and conform to the morphology of the roughness (particularly recesses 21) on the main surface 1a. 22a represents an end of each void 22 on the side of the piezoelectric material substrate, and 22b represents an end of each void 22 on the side of the supporting substrate. The voids 22 reach a bonding surface 2c of the bonding layer 2A on the side of the supporting substrate. Further, a part of voids 23 do not reach the bonding surface 2c of the bonding layer 2A and terminates within the bonding layer 2A. 23a represents an end of the void 23 on the side of the piezoelectric material substrate, and 23b represents an end of each void 23 on the side of the supporting substrate.

The void means a space which is not filled with the material forming the bonding layer. Further, the presence and shape of the void are observed and measured by cutting the bonded body (wafer) and by observing the cross section by cutting by an SEM (scanning type electron microscope). The measurement conditions are shown below.

SEM system: "Ultra55" supplied by Carl Zeiss AG
Acceleration voltage: 2 kV
magnification: 4000 folds According to the present invention, the ratio (t2/t1) of the width t2 of the void on the side of the supporting substrate with respect to the width t1 of the void at the end on the side of the piezoelectric material substrate is 0.8 or lower. Here, the width t1 of the void 22 or 23 at the end 22a or 23a on the side of the piezoelectric material substrate is defined as a width of the void 22 or 23 viewed in the direction parallel with the interface 1a between the piezoelectric material substrate 1(1A) and bonding layer 2A. However, the interface 1a includes irregularity and is curved in a microscopic view, as shown in FIGS. 6 to 13. Thus, a virtual plane P1 is set at crossing points of the void 22 or 23 and interface 1a, and the width of the void 22 or 23 on the virtual plane P1 is defined as t1.

Further, the width t2 of the end 22b or 23b of the void 22 or 23 on the side of the supporting substrate is defined as a width of the void 22 or 23 viewed in the direction in parallel with the bonding surface 2c of the bonding layer 2A. However, the bonding surface 2c may be flat or may include irregularity in a microscopic view. Thus, a virtual plane P2 is set at crossing points of the void 22 and bonding surface 2c, and t2 is assigned to the width of the void 22 on the virtual plane P2. Further, in the case that the void 23 does not reach the bonding surface, t2 is zero.

As described above, as the void extending from the piezoelectric material substrate side toward the supporting substrate side is narrower in the width toward the supporting substrate, it is considered that the mechanical strength applied by the processing and thermal stress applied by heating are appropriately dispersed. On this viewpoint, t2/t1 is made 0.8 or lower, is preferably be 0.6 or lower, and more preferably 0.3 or lower. Further, although t2/t1 may be 0, t2/t1 may preferably be larger than 0 as described below and preferably be 0.05 or larger.

According to a preferred embodiment, a recess 21 is provided on the main surface 1a of the piezoelectric material substrate 1(1A), and voids 22 or 23 is communicated with the recess 21. When the bonding layer is epitaxially grown on the piezoelectric material substrate, the crystal layer is grown in conform to the morphology of the main surface of the piezoelectric material substrate, so that such morphology tends to be generated. However, the crystal may be filled into boundaries of the voids and recesses during the crystal growth so that the ends 22a and 23a of the voids may be distant from the recesses 21, respectively.

According to a preferred embodiment, the voids 22 penetrate through the bonding layer in the thickness direction. In this case, the respective ends 22a of the voids 22 reach the main surface 1a of the piezoelectric material substrate, and the ends 22b of the void 22 on the opposite side reach the bonding surface 2c of the bonding layer 2A. The presence of the voids having such morphology is particularly preferred on the viewpoint of preventing the separation of the piezoelectric material substrate. It means that the width t2 of the void on the side of the supporting substrate is larger than 0.

Further, (width "t1" at the end of the void on the side of the piezoelectric material substrate)/(total length "l" of the void) may preferably be 0.02 or larger and more preferably be 0.03 or larger. Further, (width "t1" at the end of the void on the side of the piezoelectric material substrate)/(total length "l" of the void) may preferably be 0.08 or smaller and more preferably be 0.05 or smaller.

Further, the total length "l" of the void means a length (distance) of a total route of the void from the end on the side of the piezoelectric material substrate to the end on the side of the supporting substrate.

Preferably, the void is elongated approximately in the thickness direction L of the bonding layer. It is not necessary that the void is extended in parallel with the thickness direction L over the whole length of the void, and the void may be curved or deformed, or a plurality of lines of the voids may be communicated with each other. Further, the void may preferably be an elongate void. Further, the specific shape is not particularly limited, and may be a stripe, steak, entasis shape or the like, and these shapes may be further curved or bent.

The thickness direction L of the bonding layer means the direction perpendicular to the main surface 1a of the piezoelectric material substrate. However, the morphology of the main surface 1a is to be approximated to a flat plane and fine roughness is to be ignored.

Figure 2B:
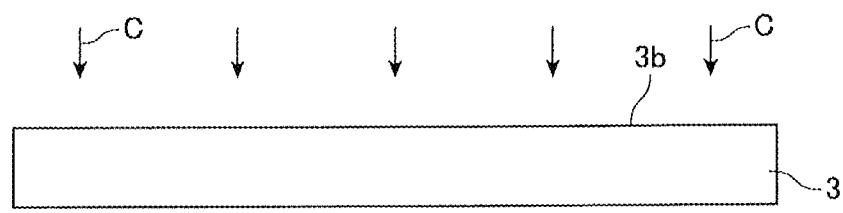
FIG. 2(b) shows the state that a bonding surface 3b of the supporting substrate 3 is activated.

According to a preferred embodiment, the bonding layer 2 contacts the main surface 3b of the supporting substrate 3. FIGS. 1 to 3 relate to this embodiment.

Further, according to a preferred embodiment, the intermediate layer 12 is present between the bonding layer 2 and supporting substrate 3. FIGS. 4 and 5 relate to this embodiment. Such intermediate layer may be composed of a single layer alone or plural layers.

The respective constituents of the present invention will be described in the order.

Although the material of the supporting substrate 3 is not particularly limited, the material is preferably selected from the group consisting of silicon, quartz, sialon, mullite, sapphire and translucent alumina. It is thus possible to further improve the temperature characteristics of frequency of the piezoelectric wave device 6 or 16.

Although the method of film-forming the bonding layer 2 and intermediate layer 12 is not particularly limited, sputtering, chemical vapor deposition method (CVD) and vapor deposition may be listed.

Although the material of the bonding layer 2A is not particularly limited, as far as the surface activation treatment is possible, a metal oxide film is preferred, and it is particularly preferred a material selected from the group consisting of silicon oxide and tantalum pentoxide. Further, as the method of surface activation treatment, an appropriate method may be selected depending on the material of the bonding layer applied. Such surface activation method includes plasma activation and FAB (Ar atomic beam).

Although the material of the intermediate layer 12 is not particularly limited, as far as the surface activation treatment is possible, a metal oxide film is preferred, and it is particularly preferred a material selected from the group consisting of silicon oxide and tantalum pentoxide. However, it is preferred to select the material of the intermediate layer different from the material of the bonding layer.

The thickness of the bonding layer 2A may preferably be 0.5 µm or larger, more preferably be 1.0 µm or larger and most preferably be 2.5 µm or larger, on the viewpoint of the present invention. Further, the thickness of the bonding layer 2A may preferably be 10 µm or smaller, more preferably be 7 µm or smaller and most preferably be 5 µm or smaller.

Further, the thickness of the bonding layer 2A may be made not smaller than the maximum roughness Rmax of the bonding surface 1a of the piezoelectric material substrate 1(1A), so that the space at the bonding interface of the both can be made smaller and the bonding strength can be further improved. On the viewpoint, the average thickness of the bonding layer 2A may more preferably be made equal to or larger than the maximum roughness Rmax of the bonding surface 1a of the piezoelectric material substrate 1(1A). Further, the upper limit of the bonding layer 2A may preferably be 2 folds or less of the maximum roughness Rmax of the bonding surface 1a, on the viewpoint of making the void reach the bonding surface 2c of the supporting substrate side.

The maximum roughness Rmax of the bonding surface 1a of the piezoelectric material substrate 1(1A) may preferably be made 0.5 to 6 µm and more preferably be made 1.0 to 4 µm.

The piezoelectric material substrate 1 used in the present invention is made lithium tantalate (LT) single crystal, lithium niobate (LN) single crystal or lithium niobate-lithium tantalate solid solution. As the materials have high propagation speeds of a surface acoustic wave and large electro-mechanical coupling factors, it is preferred for use in a surface acoustic wave device for high frequency and wide-band frequency applications.

Further, although the normal direction of the main surface 1a of the piezoelectric material substrate 1 is not particularly limited, for example, in the case that the piezoelectric material substrate 1 is made of LT, it is preferred to use the substrate rotated from Y-axis toward Z-axis by 32 to 55° (180°, 58° to 35°, 180° on Eulerian angle representation) around X-axis, which is a direction of propagation of a surface acoustic wave, because of a low propagation loss. In the case that the piezoelectric material substrate 1 is made of LN, (i) it is preferred to use the substrate rotated from Z-axis toward −Y-axis by 37.8° (0°, 37.8°, 0° on Eulerian angle representation) around X-axis, which is a direction of propagation of a surface acoustic wave, because of a large electro-mechanical coupling factor. Alternatively, (ii) it is preferred to use the substrate rotated from Y-axis toward Z-axis by 40 to 65° (180°, 50 to 25°, 180° on Eulerian angle representation) around X-axis, which is a direction of propagation of a surface acoustic wave, because a high acoustic speed can be obtained. Further, although the size of the piezoelectric material substrate 1 is not particularly limited, for example, the diameter may be 100 to 200 mm and thickness may be 0.15 to 1 µm.

Further, when the main surface 1a of the piezoelectric material substrate 1 is subjected to roughening process, lapping is preferred. It is more preferred that the lapping is performed by applying rough abrasive grains of GC #1000 or GC #2500. As the thus processed roughened surface is subjected to measurement by "New View 7300" supplied by Zygo Co. Ltd., Ra of 100 to 300 nm and Rmax value of 1.4 to 4.0 µm were shown. Alternatively, blasting may be applied to obtain the similar roughened surface.

Then, plasma is irradiated onto the bonding surface of the bonding layer 2A on the piezoelectric material substrate 1, bonding surface of the supporting substrate 3 and bonding surface of the intermediate layer 12 on the supporting substrate 3 at a temperature of 150° C. or lower to activate the bonding surfaces. Although it is preferred to irradiate nitrogen plasma on the viewpoint of the present invention, it is possible to obtain the bonded body of the invention even when oxygen plasma is irradiated.

The pressure during the surface activation may preferably be 100 Pa or lower and more preferably be 80 Pa or lower. Further, the atmosphere may be composed of nitrogen only, or oxygen only, or mixture of nitrogen and oxygen.

The temperature during the irradiation of plasma is made 150° C. or lower. It is thus possible to obtain the bonded body having a high bonding strength and without deterioration of crystallinity. On the viewpoint, the temperature during the plasma irradiation is made 150° C. or lower, and is preferably made 100° C. or lower.

Further, the energy of the irradiated plasma may preferably be 30 to 150 W. Further, a product of the energy of the irradiated plasma and a time for the irradiation may preferably be 0.12 to 1.0 Wh.

The bonding surfaces of the substrates after the plasma treatment were contacted with each other at room temperature. At this time, although the substrates may be treated under vacuum, the substrates may preferably be contacted in atmosphere.

In the case that the surface activation by the argon atomic beam is performed, it is preferred to use a system described in JP 2014-086400A to generate the argon atomic beam, which is irradiated. That is, it is used a high-speed atomic beam source of saddle field type as the beam source. Then, an inert gas is introduced into a chamber and a high voltage is applied onto electrodes from a direct current electric source. By this, electric field of saddle field type generated between the electrode (positive electrode) and a housing (negative electrode) causes motion of electrons, e, so that argon atomic and ion beams are generated. Among the beams reached at a grid, the ion beam is neutralized at the grid, and the beam of argon atoms is emitted from the high-speed atomic beam source. In the activation step by beam irradiation, the voltage may preferably be made 0.5 to 2.0 kV, and the current may preferably be made 50 to 200 mA.

According to a preferred embodiment, the bonding surfaces of the bonding layer on the piezoelectric material substrate, of the supporting substrate and of the intermediate layer on the supporting substrate are subjected to flattening process, before the surface activation treatment. The method of flattening the respective bonding surfaces includes lapping, chemical mechanical polishing (CMP) and the like. Further, the flattened surfaces may preferably have Ra of 1 nm or less and more preferably have Ra of 0.3 nm or less.

Then, the bonding surface of the bonding layer on the piezoelectric material substrate and the bonding layer of the supporting substrate 3 or bonding layer of the intermediate layer are contacted and bonded with each other. Thereafter, annealing treatment may preferably be performed to improve the bonding strength. The temperature during the annealing treatment may preferably be 100° C. or higher and 300° C. or lower.

The bonded bodies 5, 5A, 15 and 15A of the present invention may preferably be applied as acoustic wave devices 6 and 16. That is, it is an acoustic wave device including the bonded body of the present invention and electrodes provided on the piezoelectric material substrate.

An acoustic wave device 6 or 16, a surface acoustic wave device, Lamb wave-type device, thin film resonator (FBAR) or the like is known. For example, the surface acoustic wave device is produced by providing an input side IDT (Interdigital transducer) electrodes (also referred to as comb electrodes or interdigitated electrodes) for oscillating surface acoustic wave and IDT electrode on the output side for receiving the surface acoustic wave on the surface of the piezoelectric material substrate. By applying high frequency signal on the IDT electrode on the input side, electric field is generated between the electrodes, so that the surface acoustic wave is oscillated and propagated on the piezoelectric material substrate. Then, the propagated surface acoustic wave is taken out as an electrical signal from the IDT electrodes on the output side provided in the direction of the propagation.

A material forming the electrode 10 of the piezoelectric material substrate 1A may preferably be aluminum, an aluminum alloy, copper or gold, and more preferably be aluminum or the aluminum alloy. The aluminum alloy may preferably be Al with 0.3 to 5 weight % of Cu mixed therein. In this case, Ti, Mg, Ni, Mo or Ta may be used instead of Cu.

EXAMPLES

Inventive Example A

It was produced the acoustic wave device 6 shown in FIG. 3(c), according to the method described referring to FIGS. 1 to 3.

Specifically, one main surface 1b of the 42Y cut-X-propagation LiTaO$_3$ substrate (piezoelectric material substrate) 1 having a thickness of 250 μm was polished into a mirror surface, and the other main surface 1a was lapped with GC #1000. The roughness Rmax of the surface after the lapping was 3.1 um. Further, it was prepared a high-resistance (>2 kΩ·cm) Si(100) substrate (supporting substrate) 3 having a thickness of 0.23 mm. The sizes of the respective substrates were 15 mm.

The bonding layer 2 composed of a silicon oxide film having a thickness of 8 um was film-formed on the main surface (roughened surface) 1a of the piezoelectric material substrate 1 by using a sputtering system "RAS-1100C" (supplied by SHINCHRON CO., LTD.). The film-forming conditions were as follows.

Bias electric power: 6000 W
Ar gas flow: 100 sccm
Electric power of micro wave: 1500 W
O$_2$ gas flow rate: 200 sccm
rate: 0.3 nm/sec
Pressure in chamber during film-formation: 0.1 Pa The surface 2a of the bonding layer 2 after the film-formation was subjected to mirror surface processing through CMP. At this time, an average processing amount over the whole surface of the main surface 2a of the bonding layer 2 was made 4 um.

The polished surface 2b of the bonding layer 2 on the piezoelectric material substrate 1 and bonding layer 3a of the supporting substrate 3 were then subjected to cleaning and surface activation. Specifically, it was performed ultrasonic cleaning by pure water, followed by drying of the substrate surfaces by spin drying. The supporting substrate 3 after the cleaning was then introduced into a plasma activation chamber, and the bonding surface 3a of the supporting substrate was activated under nitrogen gas plasma at 30° C. Further, the piezoelectric material substrate 1 was similarly introduced into the plasma activation chamber, and the polished surface 2b of the bonding layer 2 was subjected to surface activation by nitrogen gas plasma at 30° C. The time period for the surface activation was made 40 seconds, and energy was made 100 W. The same ultrasonic cleaning and spin drying as described above were performed again, for removing particles adhered during the surface activation.

The positioning of the respective substrates was then performed and the activated bonding surfaces of the respective substrates were contacted with each other at room temperature. The substrates were contacted with the piezoelectric material substrate 1 positioned upside. As a result, it was observed the state that the adhesion of the substrates with each other was spreading (so-called bonding wave), indicating that good preliminary bonding was realized. The bonded body was then charged into an oven filled with nitrogen atmosphere and held at 120° C. for 10 hours, for improving the bonding strength.

As the bonding strength of the bonded body 5 after it was taken out of the oven was measured by crack opening method, it was proved that a very large strength of 2.8 J/m$^2$ was obtained. Further, the surface 1b of the piezoelectric material substrate 1 of the bonded body 5 was subjected to grinding until the thickness of the piezoelectric material reached 12 um, and the lapping was then performed to 7 μm. Finally, CMP processing was performed until the thickness of the piezoelectric material substrate 1A reached 6 μm. The thus obtained bonded body 5A was charged into an oven at 300° C. for 2 hours and then taken out, for confirming the heat resistance of the bonded body, and it was confirmed that cracks or separation of the piezoelectric material substrate 1A or the like was not observed.

Figure 6:
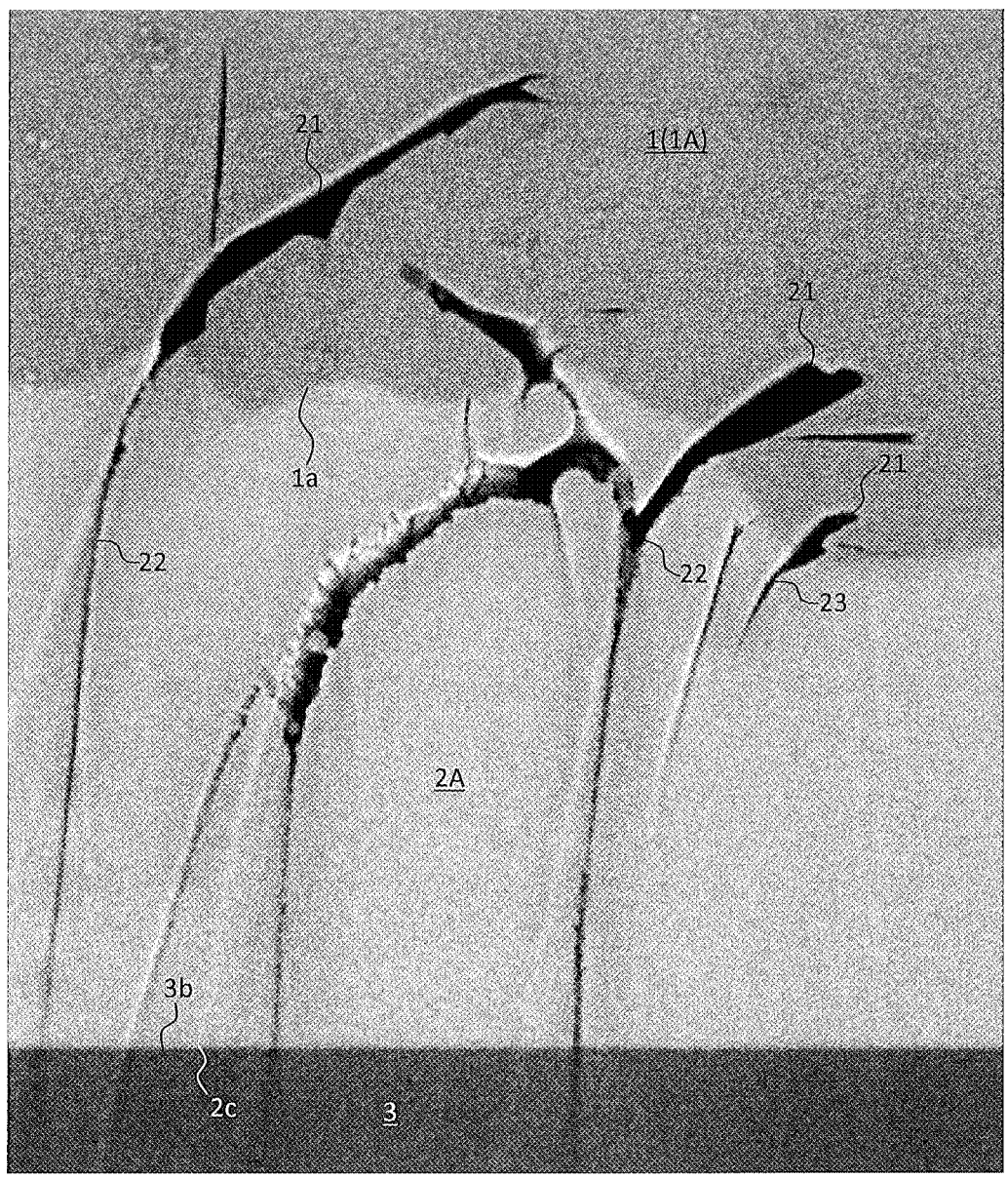
FIG. 6 shows a photograph showing an enlarged view of a bonding layer and voids according the inventive example A.
Figure 7:
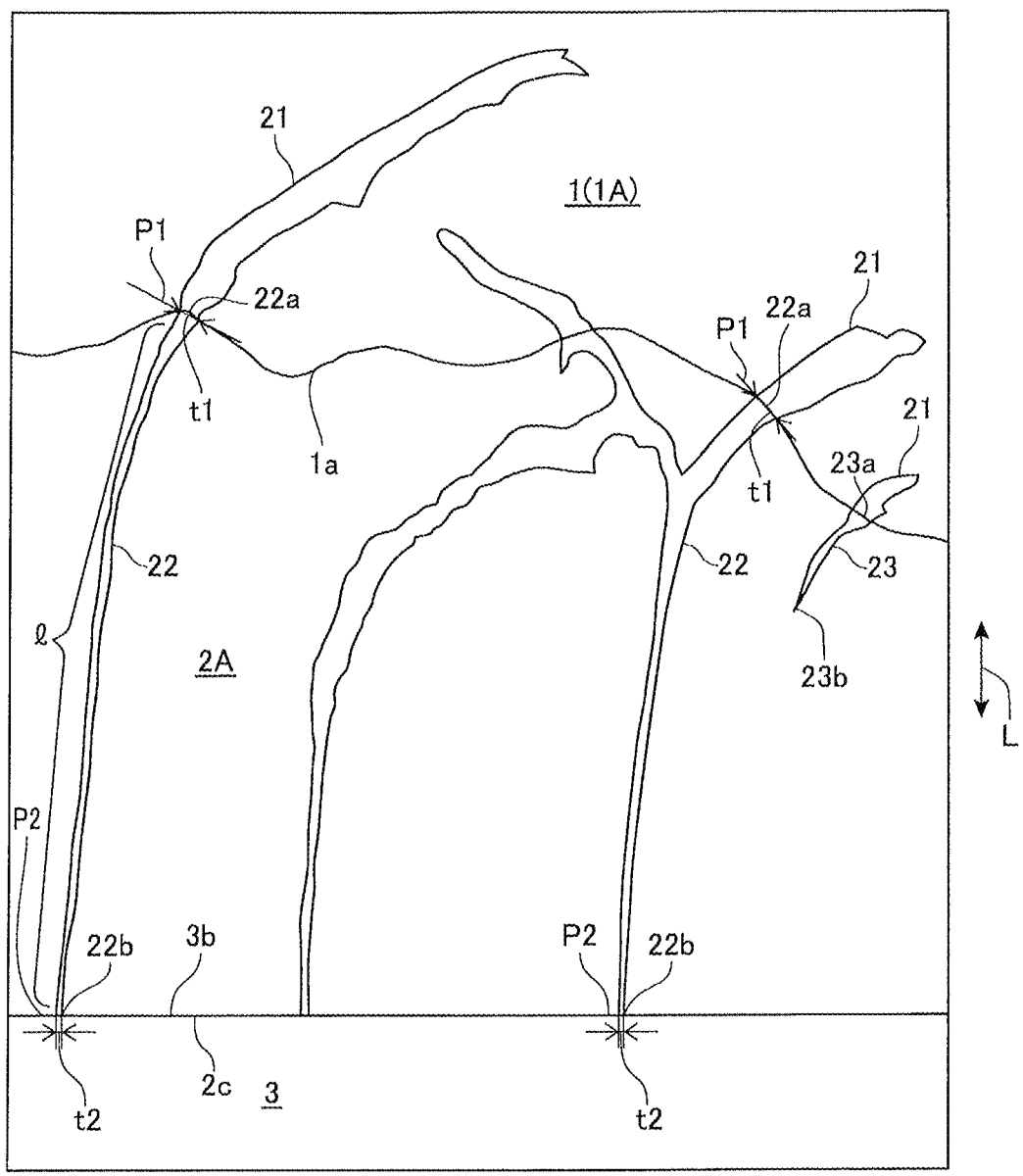
FIG. 7 is a diagram illustrating and corresponding with the photograph of FIG. 6.
Figure 8:
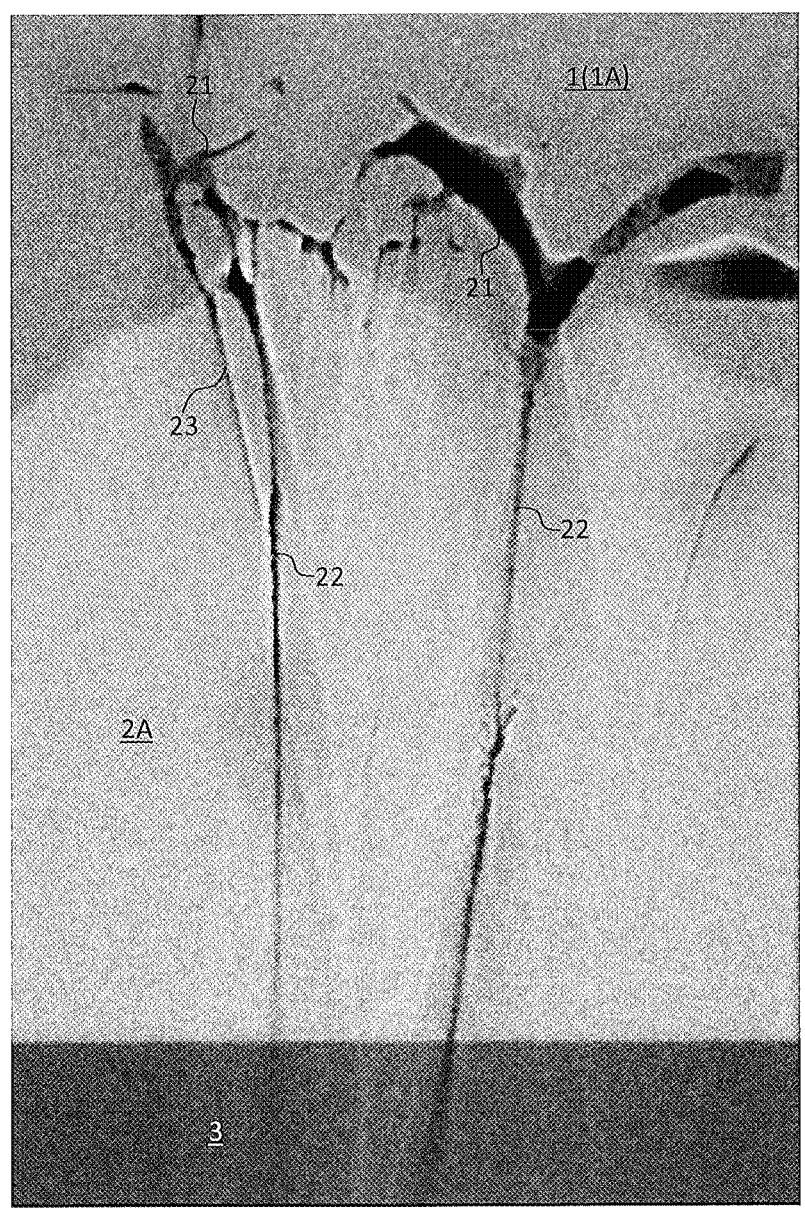
FIG. 8 is a photograph showing an enlarged view of a bonding layer and voids according to the inventive example A.
Figure 9:
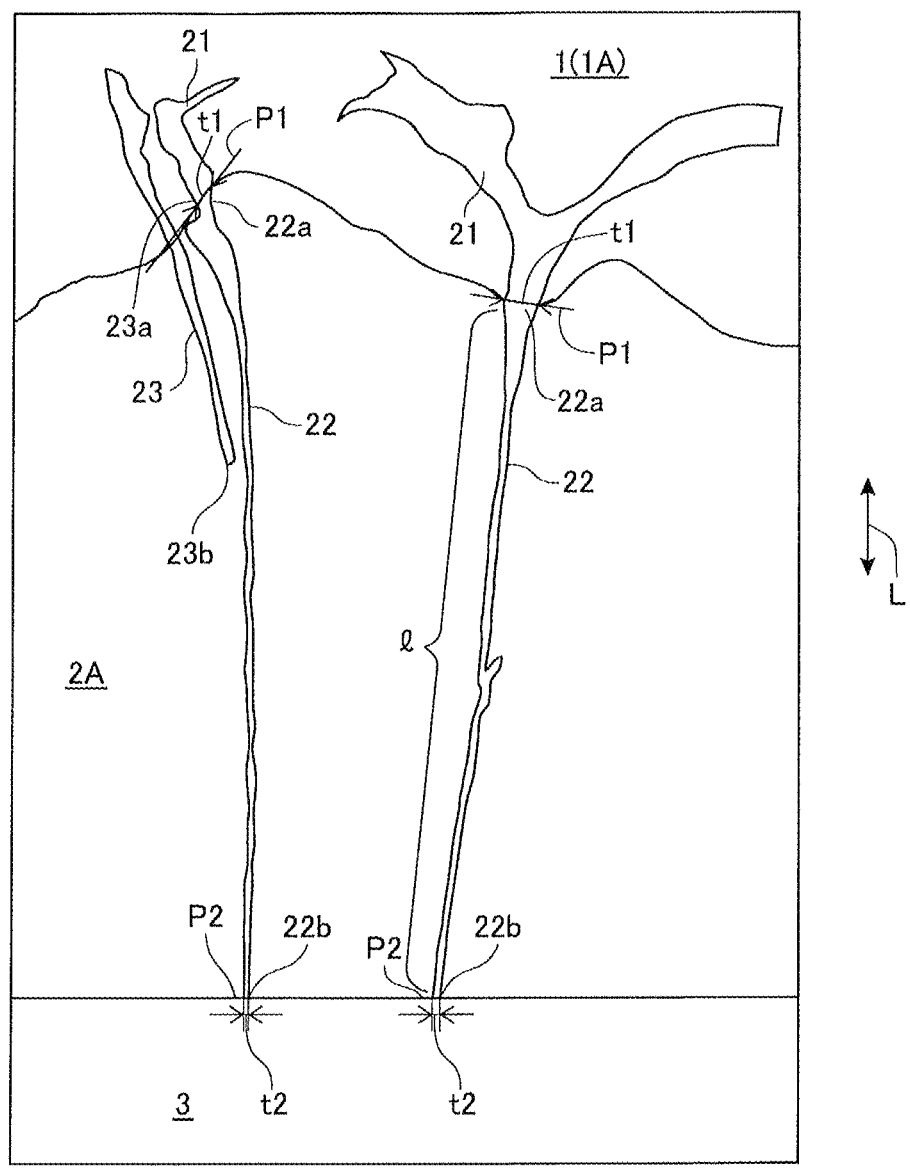
FIG. 9 is a diagram illustrating and corresponding with the photograph shown in FIG. 8.

Further, FIGS. 6 and 8 show photographs of the cross sections of the thus obtained bonded body taken as described above, respectively, and FIGS. 7 and 9 are diagrams illustrating them, respectively (explanations were given above). Further, numerical values of t1, t2 and t1/t2 of the respective voids shown in FIGS. 6 and 8 were measured based on the photographs of FIGS. 6 and 8, and the results were shown in table 1.

TABLE 1

Figure 10:
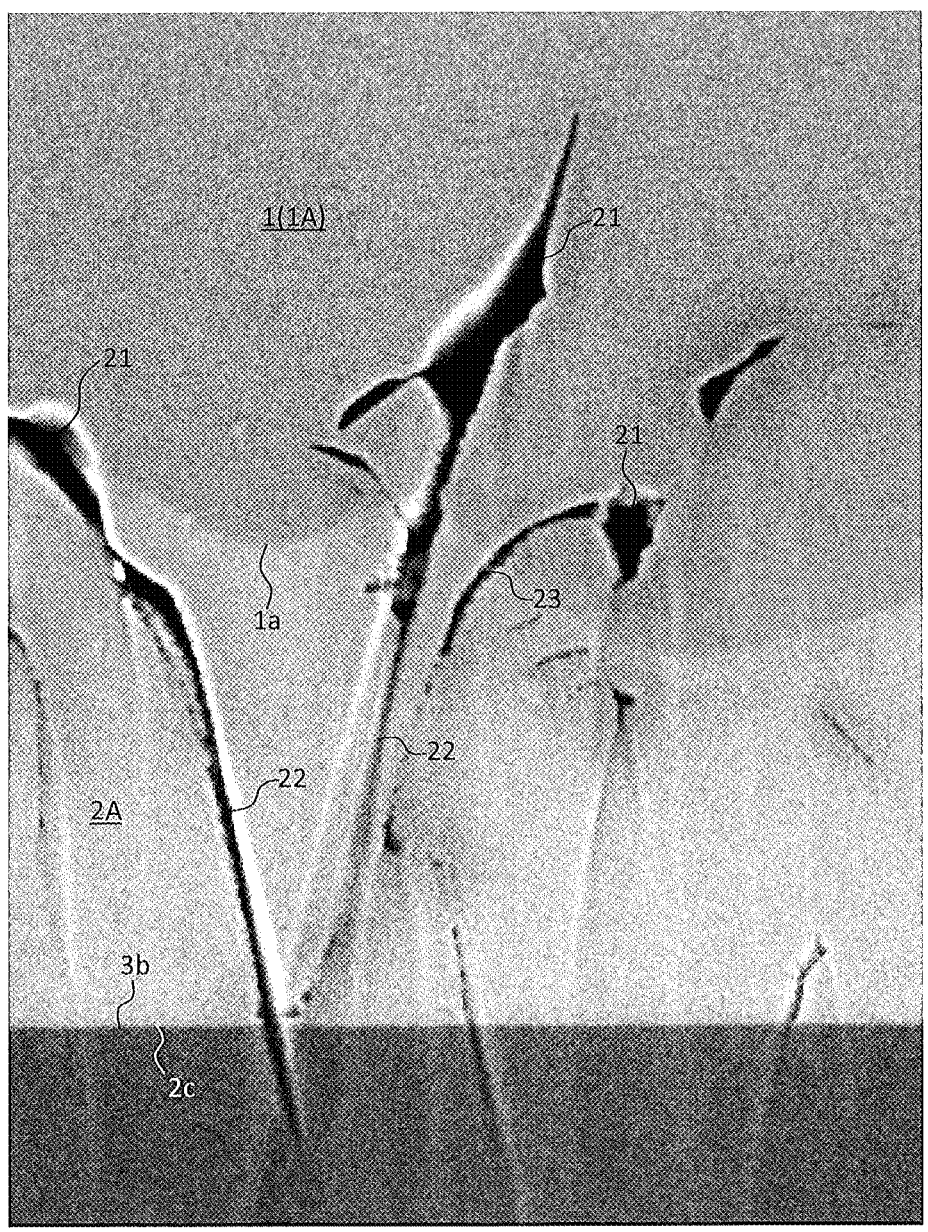
FIG. 10 is a photograph showing an enlarged view of a bonding layer and voids according to the inventive example B.
Figure 12:
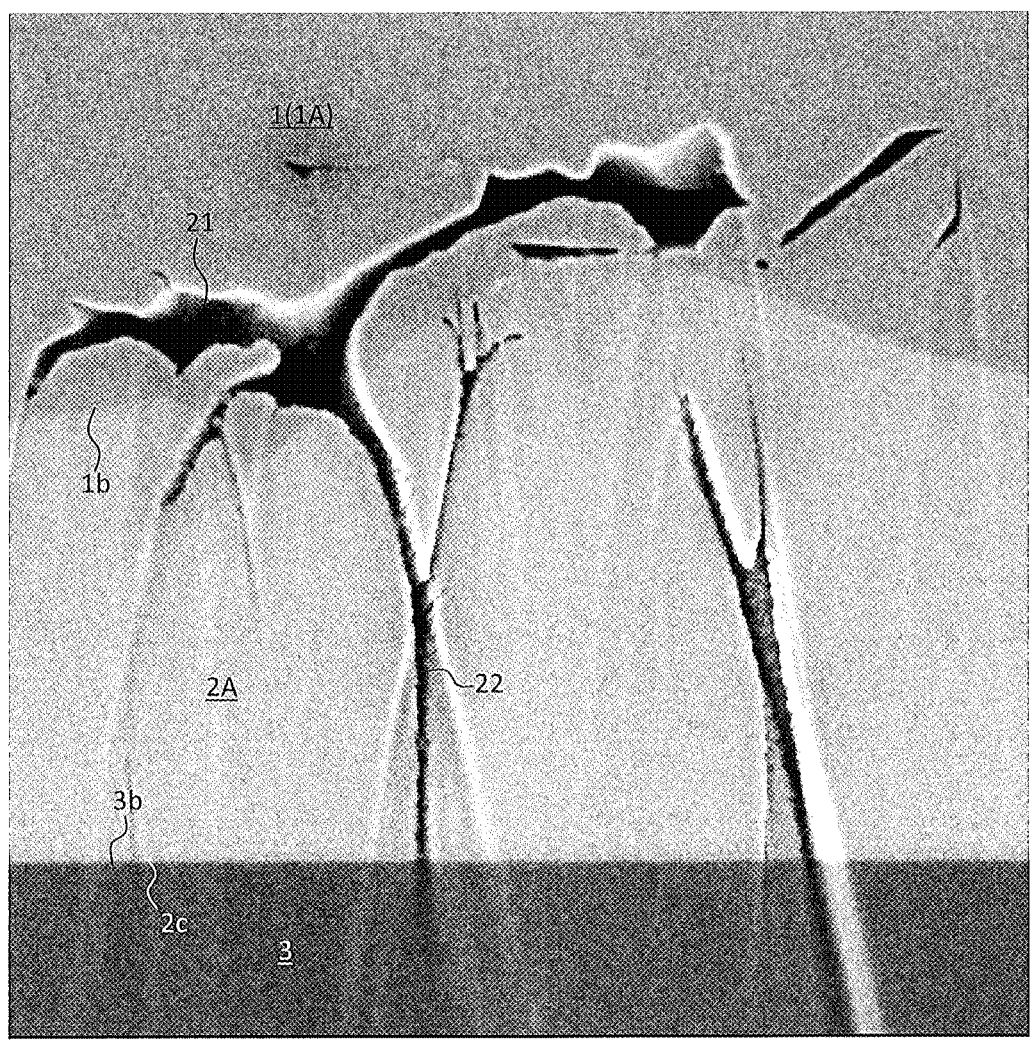
FIG. 12 is a photograph showing an enlarged view of a bonding layer and voids according to the inventive example B.
Figure 14:
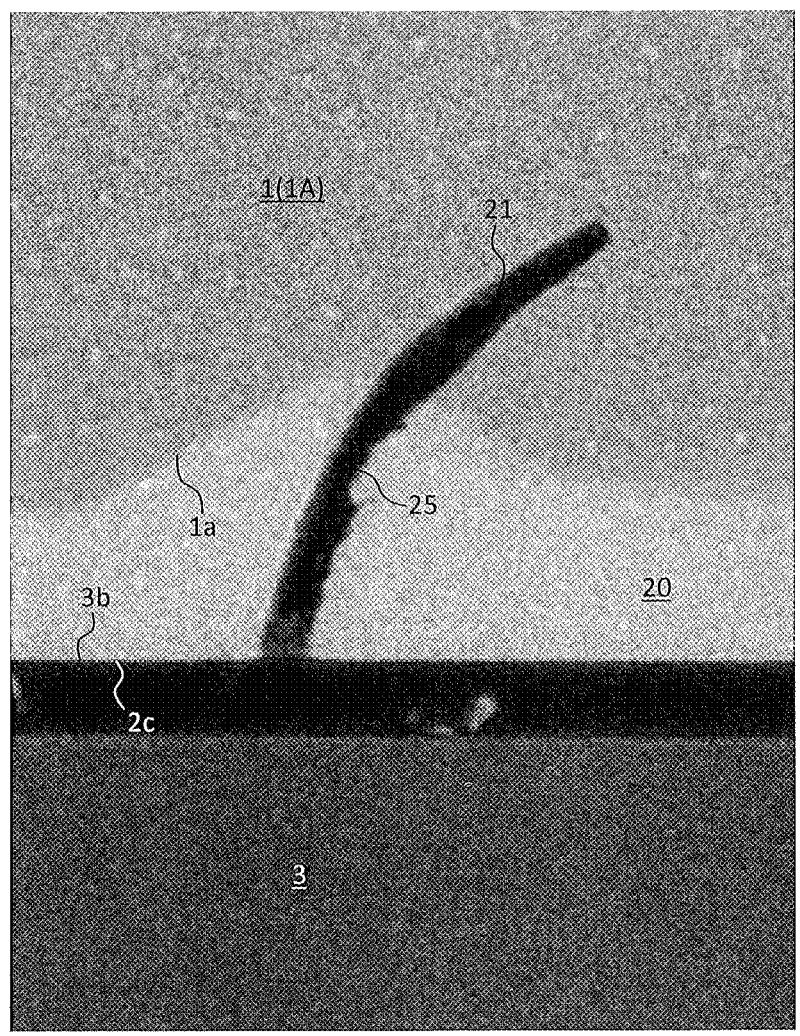
FIG. 14 is a photograph showing an enlarged view of a bonding layer and voids according to the comparative example B.

| | | Width t1 of end of void on the side of piezoelectric single crystal substrate [nm] | Width t2 of end of void on the side of supporting substrate [nm] | t2/t1 | Results after processing of 6 um |
|---|---|---|---|---|---|
| Inventive Example A | FIG. 6 | 27.8 | 158 | 0.18 | No separation |
| | | 38.9 | 167 | 0.23 | |
| | FIG. 8 | 33.3 | 160 | 0.21 | |
| Inventive Example B | FIG. 10 | 83.4 | 132 | 0.63 | No separation |
| | FIG. 12 | 61.1 | 130 | 0.47 | |
| Comparative Example B | — | 142 | 145 | 0.98 | Separated during grinding |
| | FIG. 14 | 156 | 157 | 0.99 | |

As described above, according to the bonded body of the inventive example, as the voids having the microstructure as described above are present in the bonding layer, a sufficiently high bonding strength was obtained. Further, even when the piezoelectric material substrate is processed and extremely thinned, the separation of the piezoelectric material substrate and fracture of the bonded body were prevented.

Inventive Example B

The material of the bonding layer 2A was changed to tantalum pentoxide, in the inventive example A. As a result, it was obtained the results similar to those obtained in the inventive example A. That is, the bonding strength after the heating at 120° C. was proved to be 2.2 J/m², which was sufficiently high strength for thinning process of the piezoelectric material substrate.

Figure 11:
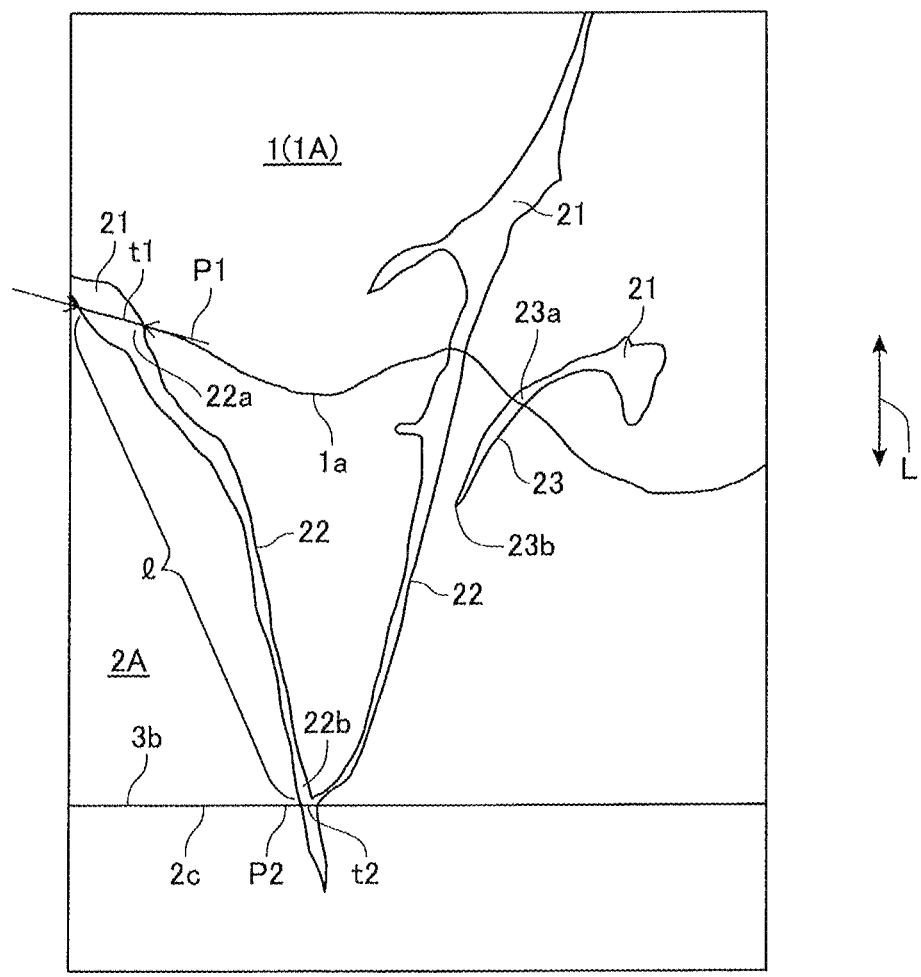
FIG. 11 is a diagram illustrating and corresponding with the photograph shown in FIG. 10.
Figure 13:
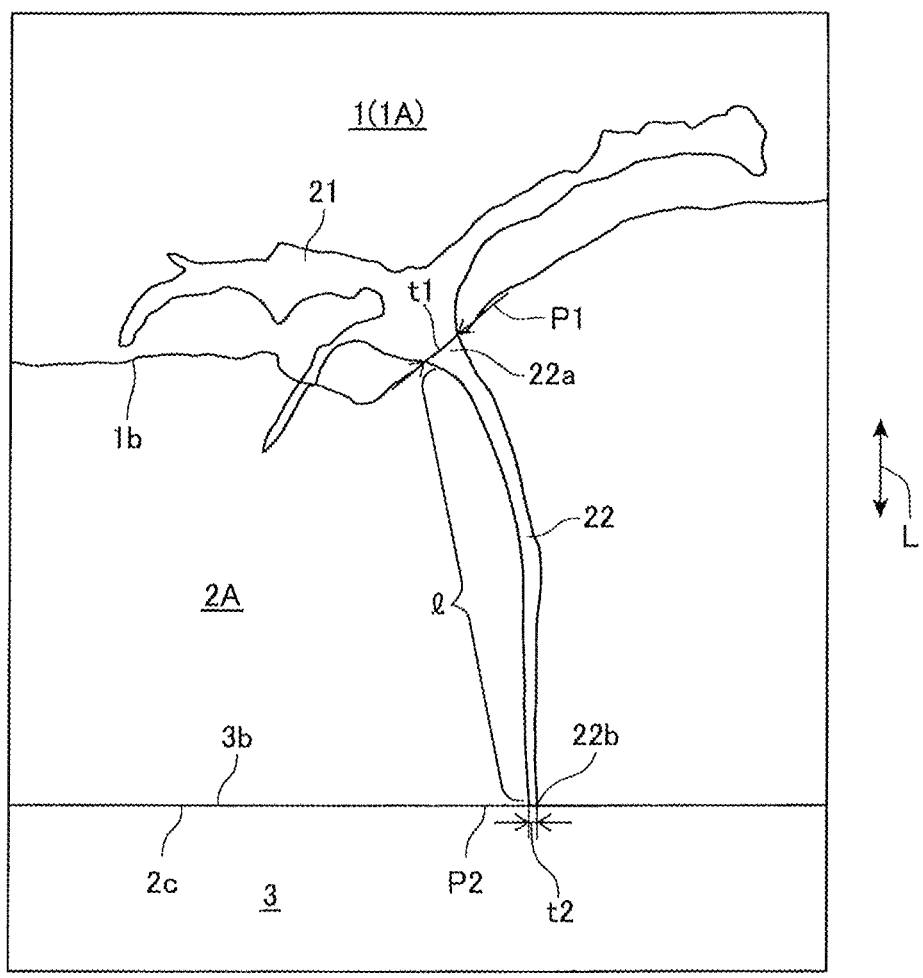
FIG. 13 is a diagram illustrating and corresponding with the photograph shown in FIG. 12.

Further, FIGS. 10 and 12 show photographs taking the cross sections of the thus obtained bonded body 5A, and FIGS. 11 and 13 are diagrams illustrating them, respectively (the explanations were given above). Further, numerical values of t1, t2 and t1/t2 of the respective voids shown in FIGS. 10 and 12 were measured from the photographs of FIGS. 10 and 12, and the results were shown in table 1.

As described above, according to the bonded body 5A of the inventive example, as the voids having the microstructure described above are present in the bonding layer 2A, a sufficiently high bonding strength was obtained. Further, as the piezoelectric material substrate is thinned by processing, the separation of the piezoelectric material substrate and fracture of the bonded body 5A were prevented.

Inventive Example C

The material of the piezoelectric material substrate 1 was changed to lithium niobate, in the inventive example A. As a result, it was obtained the results similar to those obtained in the inventive example A.

Comparative Example A

The bonded body was produced according to the same procedure as the inventive example A. However, the bias electric power during the film-formation of the bonding layer was changed to 3000 W in the inventive example A. The other conditions were made same as those in the inventive example A, and the film-formation rate of the bonding layer was lowered to 0.15 nm/sec.

The bonded body 5A was produced according to the same procedure as the inventive example A except this, and the thus obtained bonded body 5A was charged into an oven at 300° C. and then taken out of it after 2 hours. As a result, the bonded body 5A was fractured into powder.

Further, as the cross section of the bonded body 5A was observed, the texture of the bonding layer was very dense and it was not observed the voids extending from the piezoelectric material substrate toward the bonding surface on the side of the supporting substrate.

Comparative Example B

The bonded bodies 5 and 5A were produced and evaluated according to the same procedure as the inventive example A. However, different from the inventive example A, the amount of polishing process of the bonding layer was made 6 um. As a result, the bonding strength was as low as 1.7 J/m², so that the piezoelectric material substrate was separated when the thickness of the piezoelectric layer was below 14 um during the grinding process of the piezoelectric material substrate.

Figure 15:
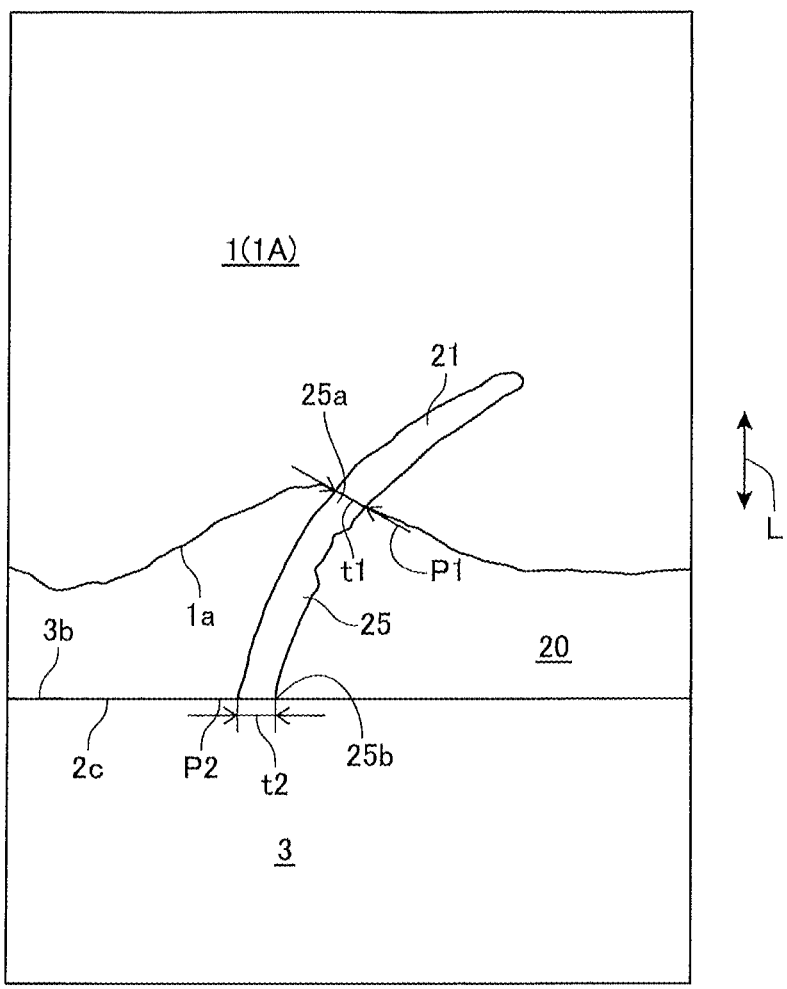
FIG. 15 is a diagram illustrating and corresponding with the photograph shown in FIG. 14.

FIG. 14 shows a photograph showing the cross section of the thus obtained bonded body 5A, and FIG. 15 is a diagram illustrating the explanation (explanation was described above). Further, numerical values of t1, t2 and t1/t2 of the voids shown in FIG. 14 were measured based on the photograph of FIG. 14, and the results were shown in table 1. Further, the same measurement was performed for a single void not shown and the results were shown in table 1.

According to the bonded body of the comparative example B, as the width of the void 25 in a bonding layer 20 at an end 25b on the side of the supporting substrate is not sufficiently smaller than that at an end 25a on the side of the piezoelectric material substrate. Although it is considerably superior than the comparative example A, the bonding strength was lower than that of the inventive example A and the separation may occur.

Comparative Example C

The bonded body was produced and evaluated according to the same procedure as that of the inventive example A. However, different from the inventive example A, the amount of the polishing process of the bonding layer was made 7 um. As a result, the bonding was not made in most parts in a plane of the bonded body and the measurement of the bonding strength was impossible. Further, as the cross section of parts at which the bonding was observed, it was proved that the separation occurred at the bonding interface.

It was further proved that the voids in the bonding layer were not sufficiently narrow at the ends on the side of the supporting substrate.

The invention claimed is:
1. A bonded body comprising:
a supporting substrate;
a piezoelectric material substrate comprising a material selected from the group consisting of lithium niobate, lithium tantalate and lithium niobate-lithium tantalate; and
a bonding layer bonding said supporting substrate and said piezoelectric material substrate and contacting a main surface of said piezoelectric material substrate, wherein said bonding layer comprises a void extending from said piezoelectric material substrate toward said supporting substrate, and wherein a ratio t2/t1 of a width t2 at an end of said void on a side of said supporting substrate with respect to a width t1 at an end of said void on a side of said piezoelectric material substrate is greater than zero and no more than 0.8.

2. The bonded body of claim 1, wherein a recess is provided on said main surface of said piezoelectric material substrate and, wherein said end of said void on the side of said piezoelectric material substrate is communicated with said recess.

3. The bonded body of claim 1, wherein said end of said void on the side of said supporting substrate reaches a bonding surface of said bonding layer on the side of said supporting substrate.

4. The bonded body of claim 1, wherein said bonding layer comprises a material selected from the group consisting of silicon oxide and tantalum pentoxide.

5. The bonded body of claim 1, wherein a bonding surface of said bonding layer on a side of said supporting substrate comprises a polished surface.

6. The bonded body of claim 1, wherein said bonding layer contacts said supporting substrate.

7. The bonded body of claim 1, further comprising an intermediate layer between said bonding layer and said supporting substrate.

8. The bonded body of claim 1, wherein said piezoelectric material substrate has a thickness of 20 μm or smaller.

* * * * *